US010608647B1

(12) United States Patent
Ranganathan et al.

(10) Patent No.: US 10,608,647 B1
(45) Date of Patent: Mar. 31, 2020

(54) DELAY ADJUSTMENT USING FREQUENCY ESTIMATION

(71) Applicant: Silicon Laboratories Inc., Austin, TX (US)

(72) Inventors: Harihara Subramanian Ranganathan, Round Rock, TX (US); Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/221,188

(22) Filed: Dec. 14, 2018

(51) Int. Cl.
*H03L 7/081* (2006.01)
*H03L 7/10* (2006.01)
*H03L 7/14* (2006.01)
*H03L 7/085* (2006.01)
*H03L 7/099* (2006.01)
*H03L 7/197* (2006.01)

(52) U.S. Cl.
CPC ............ *H03L 7/0814* (2013.01); *H03L 7/085* (2013.01); *H03L 7/0992* (2013.01); *H03L 7/10* (2013.01); *H03L 7/148* (2013.01); *H03L 7/1972* (2013.01)

(58) Field of Classification Search
USPC .................................. 327/147–149, 156–158
See application file for complete search history.

(56) References Cited

U.S. PATENT DOCUMENTS

| 6,429,693 | B1 * | 8/2002 | Staszewski | H03L 7/085 327/12 |
| 6,570,454 | B2 * | 5/2003 | Skierszkan | H03L 7/07 327/147 |
| 7,579,887 | B1 * | 8/2009 | Friedman | H03L 7/08 327/156 |
| 8,248,106 | B1 * | 8/2012 | Cohen | H03L 7/081 327/156 |
| 8,362,815 | B2 * | 1/2013 | Pavlovic | H03L 7/081 327/156 |
| 8,396,085 | B2 * | 3/2013 | Jin | H04J 3/0664 331/44 |
| 8,599,986 | B2 * | 12/2013 | Rahbar | H03L 7/085 375/327 |
| 8,686,771 | B2 * | 4/2014 | Frantzeskakis | H03L 7/10 327/150 |
| 8,786,341 | B1 | 7/2014 | Weltin-Wu et al. | |
| 8,791,734 | B1 | 7/2014 | Hara et al. | |

(Continued)

*Primary Examiner* — Adam D Houston
(74) *Attorney, Agent, or Firm* — Zagorin Cave LLP

(57) ABSTRACT

A method includes generating first frequency metrics for a first received network clock signal using a local reference clock signal. The method includes, in response to the first received network clock signal being available and satisfying a quality metric, generating a network delay estimate using a first error estimate based on the first received network clock signal, and updating stored frequency metrics for the first received network clock signal with the first frequency metrics. The method includes generating an output clock signal based on received packets and the network delay estimate. The first frequency metrics for the first received network clock signal may include a current average frequency count, a prior average frequency count, a standard deviation of prior average frequency counts and a multiplicative constant corresponding to a number of samples used to determine the current average frequency count, prior average frequency count, and standard deviation.

20 Claims, 8 Drawing Sheets

(56) References Cited

U.S. PATENT DOCUMENTS

| | | | |
|---|---|---|---|
| 9,484,938 B2 * | 11/2016 | Vandepas | H03L 1/022 |
| 9,634,861 B2 | 4/2017 | Caffee | |
| 9,705,668 B2 | 7/2017 | Huang | |
| 10,057,051 B2 | 8/2018 | Huang | |
| 10,340,927 B1 * | 7/2019 | Gambhir | H03L 7/093 |
| 10,355,699 B2 * | 7/2019 | Spijker | H03L 7/093 |
| 2002/0070811 A1 * | 6/2002 | Skierszkan | H03L 7/07 |
| | | | 331/1 A |
| 2008/0204092 A1 * | 8/2008 | Moehlmann | H03L 7/093 |
| | | | 327/156 |
| 2009/0256601 A1 * | 10/2009 | Zhang | H03L 7/085 |
| | | | 327/156 |
| 2011/0007859 A1 * | 1/2011 | Ueda | H03L 7/0802 |
| | | | 375/376 |
| 2011/0032013 A1 * | 2/2011 | Nelson | B60Q 1/444 |
| | | | 327/156 |
| 2015/0145567 A1 * | 5/2015 | Perrott | H03L 7/093 |
| | | | 327/156 |
| 2016/0079991 A1 * | 3/2016 | Pelissier | H04L 7/0079 |
| | | | 327/158 |
| 2017/0187481 A1 | 6/2017 | Huang et al. | |
| 2019/0007055 A1 * | 1/2019 | Nelson | H03L 7/0807 |

* cited by examiner

DELAY ADJUSTMENT USING FREQUENCY ESTIMATION

BACKGROUND

Field of the Invention

The present invention relates to electronic devices and more particularly to clock signals for electronic devices.

Description of the Related Art

In general, data transport networks (e.g., Ethernet, broadcast video, wireless networks) need not communicate clock synchronization information. However, other network clocks (e.g., a Global Positioning System (GPS) clock signal) can be used for clock synchronization. However, GPS receivers may be expensive, GPS time signals may experience time offsets between receivers, and GPS time signals may be unavailable in some applications or under some circumstances. In addition, although GPS time signals are stable on average, they may be erroneous over short time periods. A remote master clock can send timestamp information over data networks for synchronization by local clocks. IEEE specification 1588-2008 Precision Time Protocol (PTP), and Synchronous Ethernet (SyncE) ITU-T Rec. G8262 are exemplary Timing over Packet (ToP) technologies for synchronizing clock frequency across devices in computing, wireline, and wireless networks and for improving clock accuracy to satisfy timing requirements of a target application.

For example, IEEE specification 1588-2008 PTP is a master/slave packet-based solution for synchronizing clock signals throughout a computing network based on message exchanges across a communications medium. Actual clock values (e.g., timestamps) are communicated inside payloads of special packets dedicated to the task. A grandmaster node (T-GM) transmits synchronization information to the clocks residing on its network segment. Boundary clock nodes (T-BC) with a presence on that segment then relay accurate time to other segments to which they are also connected. Assisted Partial Timing Support (T-APTS) is an approach for timing in a wireless environment (e.g., Long Term Evolution standard, i.e., LTE) and is similar to the boundary clock implementation. A clock product may be configured to comply with one or more of the T-BC, T-GM, or T-APTS specifications.

Referring to FIG. 1, clock product 100 includes controller 102 and clock integrated circuit 104, which monitors at least one received clock signal (e.g., using clock signal REFQ generated using a local, external crystal coupled to REFQ input terminal) and provides at least one output clock signal and at least one error signal. Controller 102 provides configuration information to clock integrated circuit 104 via IN SEL[0:1]. Clock integrated circuit 104 provides clock quality information (e.g., LOSREFQ or FOS[0:2]) to controller 102, which outputs one or more alarm signals (e.g., CLK_FAULT) based on the clock quality information.

Referring to FIG. 2, in at least one embodiment, clock integrated circuit 104 includes a multi-loop phase-locked loop that generates output clock signal CLKOUT having low jitter, by locking input clock signal CLKIN to a clock signal provided by reference clock source 206. Inner phase-locked loop 202, is a first phase-locked loop that includes phase/frequency detector 212, loop filter 214, and voltage-controlled oscillator 216. Voltage controlled oscillator 216 may be implemented as a ring oscillator, an LC oscillator, or other suitable oscillator structure. Phase/frequency detector 212 receives the clock signal from reference clock source 206, which includes a fixed source such as the crystal oscillator (described above), a microelectromechanical structure (MEMS) oscillator, or other suitable low-jitter source. Outer phase-locked loop 204 is another phase-locked loop that includes phase/frequency detector 222, loop filter 224, divider 226, and uses inner phase-locked loop 202 as a digitally controlled oscillator responsive to digital divider ratio DIVM which may be a fractional divider value provided by loop filter 224. Phase/frequency detector 222 receives input clock signal CLKIN and a feedback signal, which may be a frequency-divided version of CLKOUT. Phase/frequency detector 222 provides a phase error signal reflecting the difference between input clock signal CLKIN and the feedback signal. The frequency of CLKOUT is determined by the frequency of reference clock source 206 and the divider ratio generated by outer phase-locked loop 204 and provided to divider 218 in the feedback path of inner phase-locked loop 202. Outer phase-locked loop 204 adjusts divider ratio DIVM to match the frequency of CLKOUT to the frequency of input clock signal CLKIN or to a multiple (DIVN) of the frequency of input clock signal CLKIN (e.g., CLKIN=CLKOUT/DIVN).

In an embodiment of clock integrated circuit 104, when holdover controller 225 detects a holdover condition (i.e., when input clock signal CLKIN is invalid, which may be indicated by a loss of signal condition indicator or an out-of-frequency condition indicator) holdover controller 225 freezes loop filter 224 of outer phase-locked loop 204 such that divider ratio DIVM no longer tracks changes to input clock signal CLKIN, and selects a held output of the loop filter 224, or a value based on a held output of loop filter 224, to be provided to divider 218, thereby holding steady the frequency of CLKOUT. For example, holdover control 225 of outer phase-locked loop 204 holds the output of loop filter 224 to a value corresponding to a value of input clock signal CLKIN received prior to entering the holdover mode so that no updating of DIVM occurs. In at least one embodiment of clock integrated circuit 104, during holdover mode, the feedback divider ratio provided by the outer loop to divider 218 is based on past divider values (e.g., is an average of past divider values). When the divide ratio is frozen, the output frequency of CLKOUT varies only based on frequency variation of reference clock source 206.

A typical reference clock source 206 is a relatively low-cost clock source having a jitter performance that satisfies jitter specifications for a target application. Such typical reference clock sources generate signals having a frequency that is highly dependent on temperature (e.g., approximately 15 parts-per-million (ppm)). Such poor temperature stability of reference clock source 206 results in CLKOUT having low-frequency drift after a loss of input clock signal CLKIN. That low-frequency drift may be unacceptable for a target application. A technique that improves the stability of an output clock signal when an input clock signal disappears (i.e., reduces low-frequency drift after loss of input clock signal CLKIN), locks inner phase-locked loop 202, which is used as the digitally controlled oscillator for outer phase-locked loop 204, to a temperature-stable reference clock signal generated by a frequency-stable reference clock having high temperature stability. For example, an oven-controlled crystal oscillator (OCXO) or temperature-compensated crystal oscillator (TCXO) may be used by reference clock 206.

Referring to FIGS. 2 and 3, in at least one embodiment of a clock product, holdover controller 225 implements a technique for validating input clock signal CLKIN that determines whether input clock signal CLKIN exists and/or whether the frequency of input clock signal CLKIN is within an expected range. Frequency monitor 404 generates an indication of whether input clock signal CLKIN has a frequency in the range of reference clock signal REFCLK. Loss-of-signal detector 406 determines whether input clock signal CLKIN is present. If either the frequency of input clock signal CLKIN is out of the target frequency range or a loss-of-signal condition is detected, holdover detector 410 generates an indication that input clock signal CLKIN has failed. That indicator may be buffered in holdover storage 408. Holdover detector 410 provides an indication that triggers the holdover mode to select circuit 420, which selects a digital control value to be provided to inner phase-locked loop 202 (e.g., to control a digitally-controlled oscillator). For example, when the holdover mode is enabled, holdover controller 225 provides a value of the output of the digital loop filter 224 that has been stored in a holdover storage element 408. Otherwise, holdover controller 225 provides a dynamically updated output of a loop filter to the digitally-controlled oscillator.

Referring to FIG. 4, cascaded phase-locked loop techniques described above may be implemented in a clock product that generates multiple low-jitter, frequency-stable clock signals. Inner phase-locked loop 202 and outer phase-locked loop 204, are configured to provide a frequency-stable, low-jitter clock signal to multiple outer phase-locked loops 305. Each outer phase-locked loop 305 may be separately configured to generate an output clock signal, CLKOUT1, CLKOUT2, CLKOUT3, and CLKOUT4, having a different frequency based on corresponding input clock signals CLKIN1, CLKIN2, CLKIN3, and CLKIN4, respectively, and corresponding divider values, DIV3_1, DIV3_2, DIV3_3, and DIV3_4, respectively. In at least one embodiment of a clock product, each outer loop PLL 305 includes a typical digitally controlled oscillator. Clock product 400 may receive signals from additional reference clock products (e.g., a temperature-controlled crystal oscillator, an oven-controlled crystal oscillator, another reference clock product, and/or other reference clock products) coupled to additional corresponding outer phase-locked loops 204 cascaded with inner phase-locked loop 202 to adjust the phase noise of the output clock signal(s) for a target application.

In at least one embodiment of clock product 400, instead of including a typical digitally controlled oscillator (e.g., a voltage-controlled oscillator-based phase-locked loop), each outer phase-locked loop 305 includes an interpolative divider and associated digital logic. Eliminating the typical digitally controlled oscillators from outer phase-locked loops 305 reduces the size of the clock product as compared to embodiments including typical digitally controlled oscillators in outer phase-locked loops 305. In addition, the use of the interpolative divider as a digitally controlled oscillator allows use of digital loop filters in the outer phase-locked loops 305, which typically are smaller than analog loop filters. Thus, clock product 400 can generate multiple output clock signals each having a different output frequency using one voltage-controlled oscillator in a core phase-locked loop (e.g., inner phase-locked loop 202). In addition, eliminating the digitally controlled oscillators in outer phase-locked loops 305, reduces or eliminates cross talk that may result from multiple LC oscillators used in clock products with multiple voltage-controlled oscillators.

The timing errors in network clock signals can be variable (e.g., up to ±1 µs) but are required to meet specifications (e.g., bound within ±20 ns or bound within ±5 ns). Clock product 400 may receive a network clock (e.g., SyncE clock, GPS clock, or clock based on PTP packets) Precision Time Protocol loops (e.g., T-Boundary Clock and T-Assisted Partial Time Support) and provide an output clock to slaves. However, the network clocks can be unreliable and may require estimation of channel effects (e.g., antenna angles, measurement time offset between GPS receivers, and routing or queuing delays for PTP packets). Accordingly, improved techniques for generating a timing clock from a received input clock are desired.

SUMMARY OF EMBODIMENTS OF THE INVENTION

In at least one embodiment of the invention, a method includes generating first frequency metrics for a first received network clock signal using a local reference clock signal. The method includes, in response to the first received network clock signal being available and satisfying a quality metric, generating a network delay estimate using a first error estimate based on the first received network clock signal, and updating stored frequency metrics for the first received network clock signal with the first frequency metrics. The method includes generating an output clock signal based on received packets and the network delay estimate. The first received network clock signal may be a Global Positioning System (GPS) clock signal. The first frequency metrics for the first received network clock signal may include a current average frequency count (C), a prior average frequency count (A), a standard deviation of prior average frequency counts (S) and a multiplicative constant (x) corresponding to a number of samples used to determine the current average frequency count, prior average frequency count, and standard deviation. The method may include determining availability of the first received network clock signal based on the first frequency metrics, second frequency metrics for a second received network clock signal, and third frequency metrics for a second local clock signal.

In at least one embodiment of the invention, a clock product includes a frequency estimator configured to use a local clock signal as a reference clock signal to generate first frequency metrics for a first received network clock signal, second frequency metrics for a second received network clock signal, and third frequency metrics for a second local clock signal. The clock product includes a control circuit configured to generate a network delay estimate using a first error estimate based on the first received network clock signal and to update stored frequency metrics for the first received network clock signal with the first frequency metrics, in response to the first received network clock signal being available and satisfying a quality metric. The clock product is configured to generate an output clock signal based on received packets and the network delay estimate. The first received network clock signal may be a Global Positioning System (GPS) clock signal. The first frequency metrics for the first received network clock signal may include a current average frequency count (C), a prior average frequency count (A), a standard deviation of prior average frequency counts (S) and a multiplicative constant (x) corresponding to a number of samples used to determine the current average frequency count, prior average frequency count, and standard deviation. The control circuit may determine availability of the first received network clock signal based on the first frequency metrics, second frequency metrics for a second received network clock signal, and third frequency metrics for a second local clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
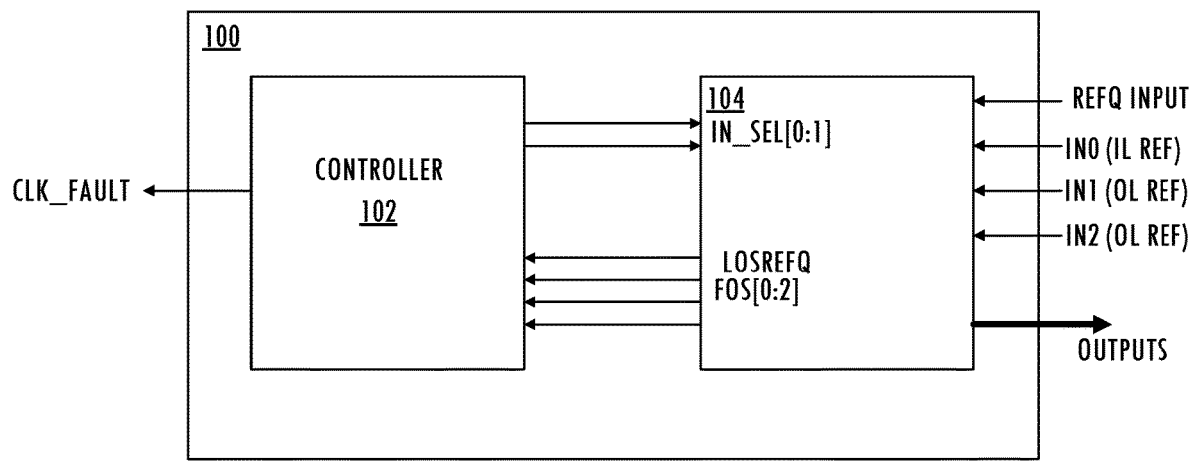
FIG. 1 illustrates a functional block diagram of a clock product.
Figure 2:
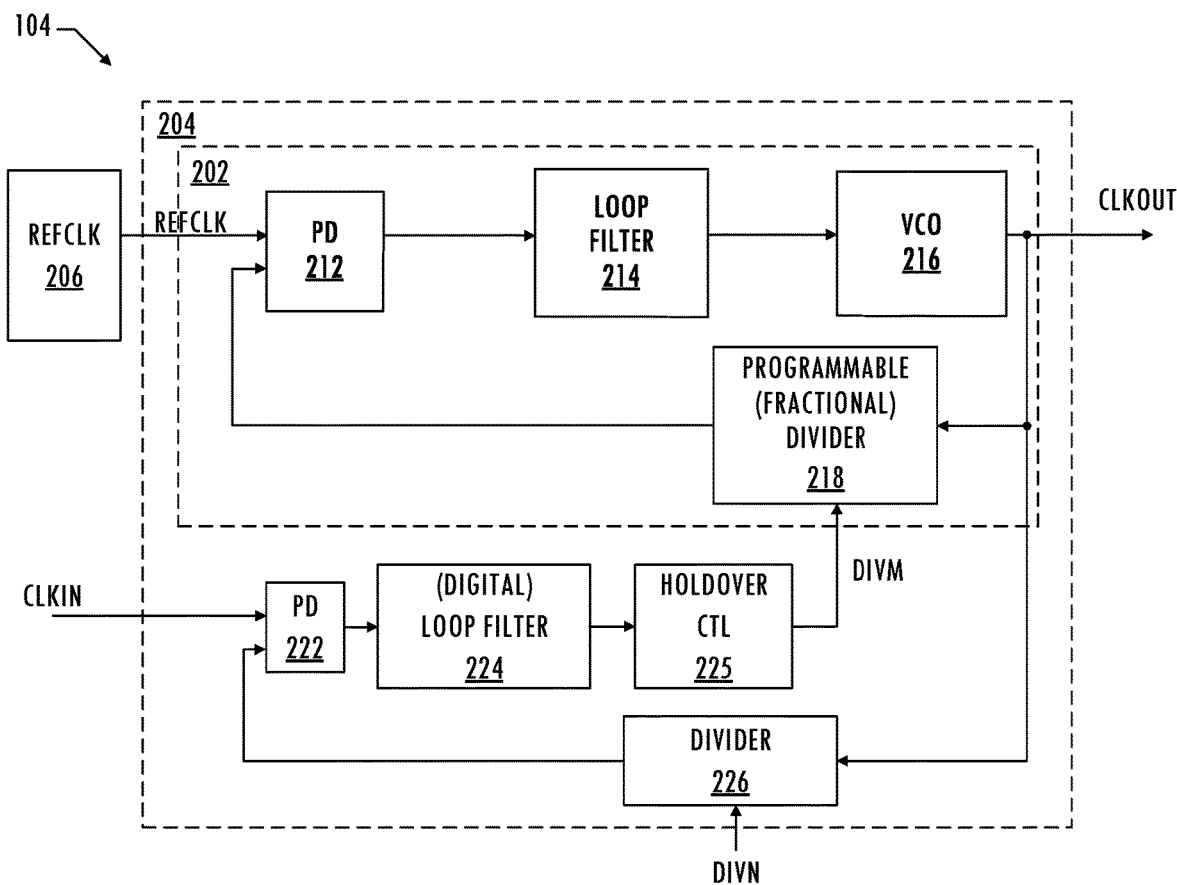
FIG. 2 illustrates a functional block diagram of an exemplary cascaded phase-locked loop clock generation circuit.
Figure 3:
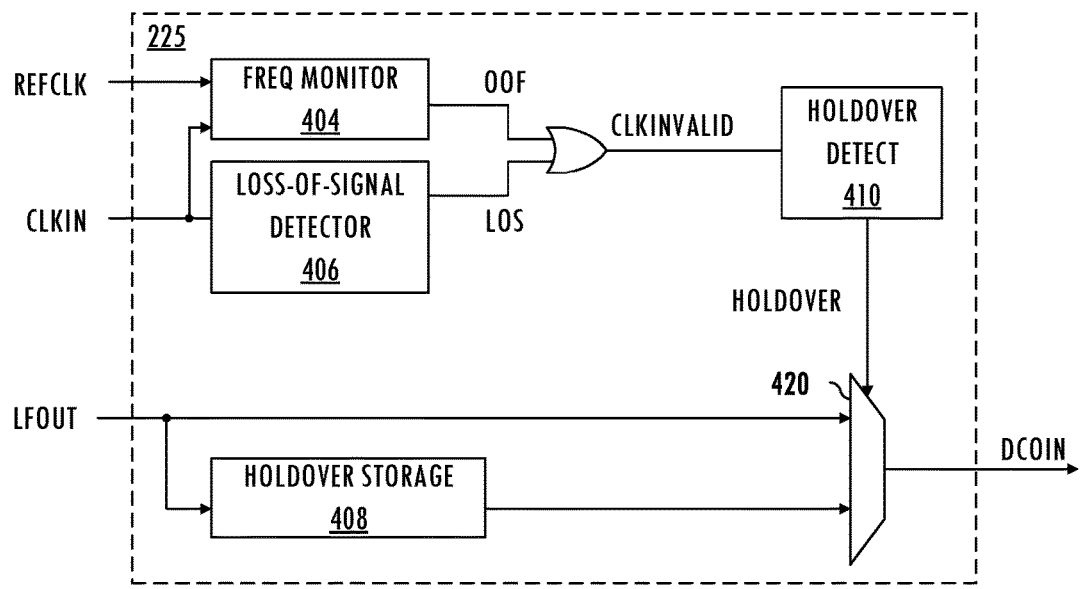
FIG. 3 illustrates a functional block diagram of holdover circuitry of the clock generation circuit of FIG. 2.
Figure 4:
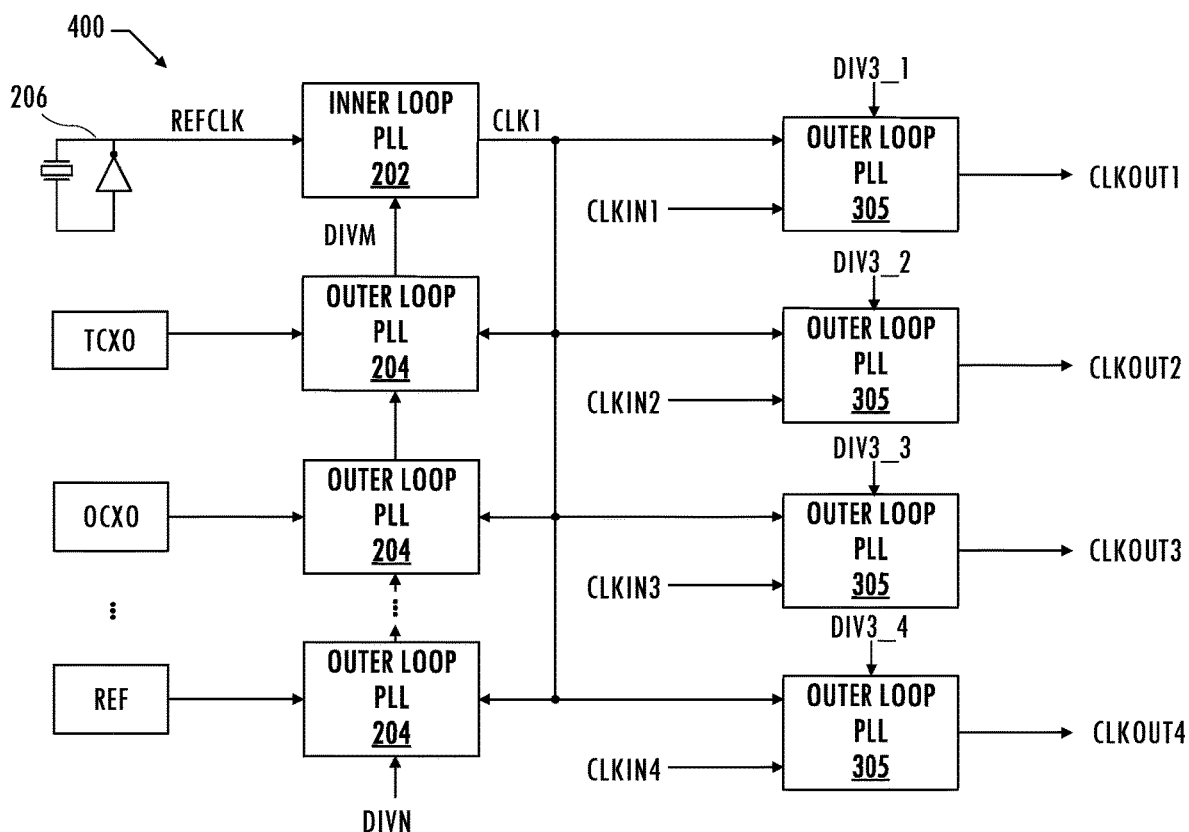
FIG. 4 illustrates a functional block diagram of an exemplary cascaded phase-locked loop clock generation circuit configured to generate multiple clock signals.
Figure 5:
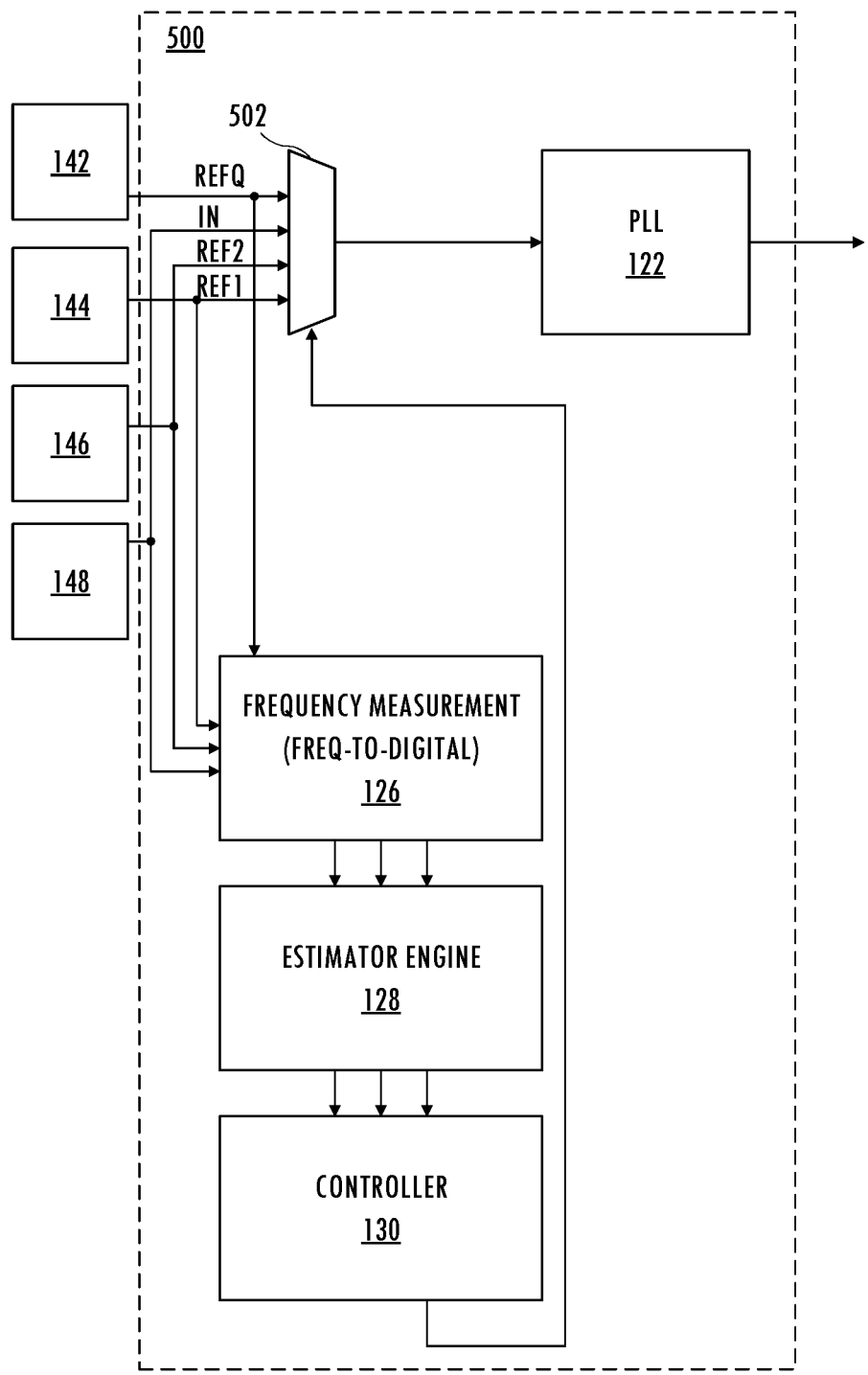
FIG. 5 illustrates a functional block diagram of clock generation circuitry using frequency estimation to select an active clock signal for a phase-locked loop consistent with at least one embodiment of the invention.

Referring to FIG. 5, in at least one embodiment, clock product 500 receives various clock signals and uses one of those clock signals as a sensor clock signal (e.g., clock signal REFQ generated by crystal 142) to sense other clock signals (i.e., sensed clock signals, e.g., clock signal REF1 generated by crystal oscillator 144, clock signal REF2 generated by crystal oscillator 146, network clock signal IN provided by receiver 148 and generated based on an atomic clock reference (e.g., SyncE, GPS, SONET, or PTP timestamps)). Those clock signals have varying levels of jitter, stability, and reliability that are compared in the table below:

| clock source | type | clock jitter | clock stability | likelihood of clock failure |
|---|---|---|---|---|
| reference oscillator | internal | okay | bad | 1 |
| crystal (REFQ) | input | excellent | okay | 4 |
| crystal oscillator input (REF1) | input | good | good | 3 |
| TCXO/OCXO (REF2) | input | okay | very good | 2 |
| network source (IN) | input | bad | excellent | 5 |

Clock product 500 estimates the quality of the sensor clock signal using the sensed clock signals. For example, frequency measurement engine 126 performs a frequency-to-digital conversion of the sensed clock signals using the sensor clock signal. In at least one embodiment, frequency measurement engine 126 includes one or more counters controlled by the sensor clock signal to generate time stamps for each sensed clock signal. Those time stamps may be stored in buffers corresponding to each sensed clock signal and provided to estimator engine 128. Estimator engine 128 determines and stores statistics that are used to estimate the state or quality of the sensor clock signal and each of the sensed clock signals. The sampling rate (i.e., the rate at which the clock product collects these statistics), the measurement window (i.e., the time to measure each sample of a statistic), and the initial startup time (i.e., the minimum amount of time required for statistics to be valid after every state transition defined by a number of measurement samples) determines the speed of response of the clock product to clock quality changes and precision of clock quality measurements. The sampling rate and measurement window vary with implementation details.

If frequency measurement engine 126 provides one frequency measurement every $t_m$ seconds for each of r clock signals, and estimator engine 128 processes frequency measurements for each of r clock signals in series, then $r \times t_m$ is the window size and controller 130 can make a decision at a rate of $r \times t_m$ seconds under steady-state operations. The measurement time should be short enough that the resulting statistics are correlated to the clock signal. If $t_m$ is too long, then the statistics are not sufficiently correlated to the clock signal. For example, if an application requires a decision once per millisecond, then the window size should be sufficiently smaller than 1 millisecond to guarantee computation of the statistics for r clock signals during a 1 millisecond window. In such embodiments, only frequency transients with a time constant of 1 millisecond or larger can be tracked. A target window size can be achieved by adjusting r or $t_m$ and the fastest update rate for decision-making is $1/(r \times t_m)$.

In at least one embodiment, estimator engine 128 processes frequency measurements for each of r clock signals in parallel. The frequency of each clock signal is measured in a window of $t_m$ seconds. Window $t_m$ is set by the period of the slowest clock signal and the sampling rate is set by the fastest clock signal. In at least one embodiment, the frequency estimation technique sets $t_{mi}$, where $0 < i < r$ for r clock signals, to be a function of the time period of the $i^{th}$ clock signal. Ideally, $t_{mi}=1$ clock period of the $i^{th}$ clock signal. In at least one embodiment, the frequency estimation technique sets the sampling rate to be ten times the maximum $t_{mi}$.

The number of measurement samples collected for each estimate determines the precision of the estimate. If estimator engine 128 collects N frequency samples from frequency measurement engine 126, then a multiplication factor for the number of standard deviations between the average frequency count and the nearest specification limit (i.e., sigma)

of the statistics is defined by N. For example, if controller 130 is to make a decision between +/−3 sigma for a clock signal, then estimator engine 128 needs to collect 1000 continuous samples for the clock signal from frequency measurement engine 126. Thus, as N increases, precision increases, but the startup time also increases.

Controller 130 uses the collected statistics to generate one or more control signals to configure clock product 500 for a target application. For example, controller 130 selectively enables select circuit 502 to provide an active clock signal to phase-locked loop 122 according to the statistics and the target application, which may be selected using predetermined mode information in a storage element or provided from integrated circuit terminals. In another embodiment, select circuit 502 selects from a subset of available clock signals (e.g., selects from clock signal REFQ and clock signal REF1 only), while available clock signals are used by frequency measurement engine 126 and estimator engine 128 to provide statistics to controller 130 for use in selecting the active input to phase-locked loop 122. In at least one embodiment of clock product 500, when only one of the clock sources has a frequency error that is outside the target statistical range, that source is flagged as erroneous.

Figure 6:
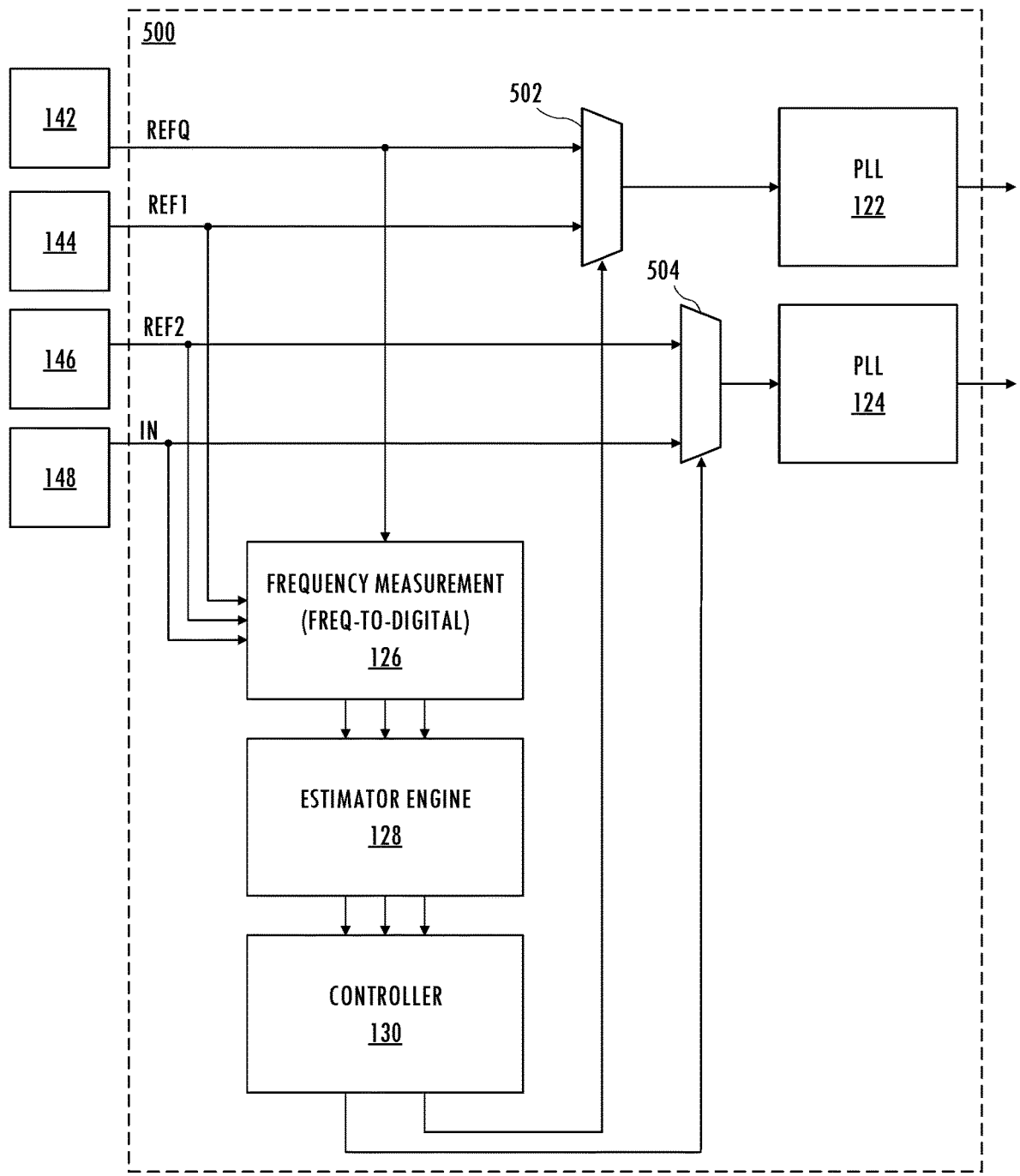
FIG. 6 illustrates a functional block diagram of clock generation circuitry using frequency estimation to select active clock signals for independent phase-locked loops consistent with at least one embodiment of the invention.
Figure 8:
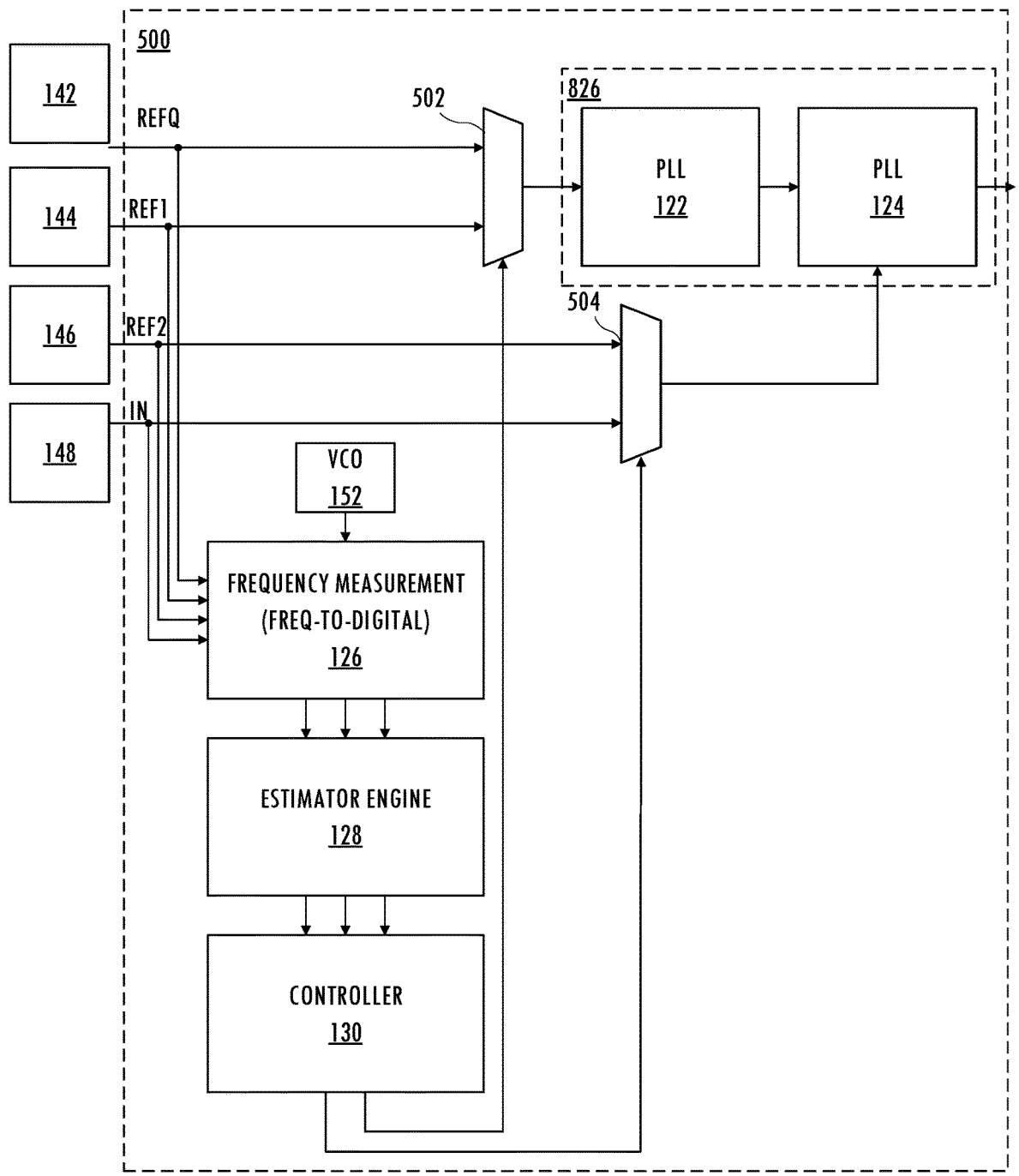
FIG. 8 illustrates a functional block diagram of clock generation circuitry including an on-chip voltage-controlled oscillator using frequency estimation to select active clock signals for cascaded phase-locked loops consistent with at least one embodiment of the invention.
Figure 9:
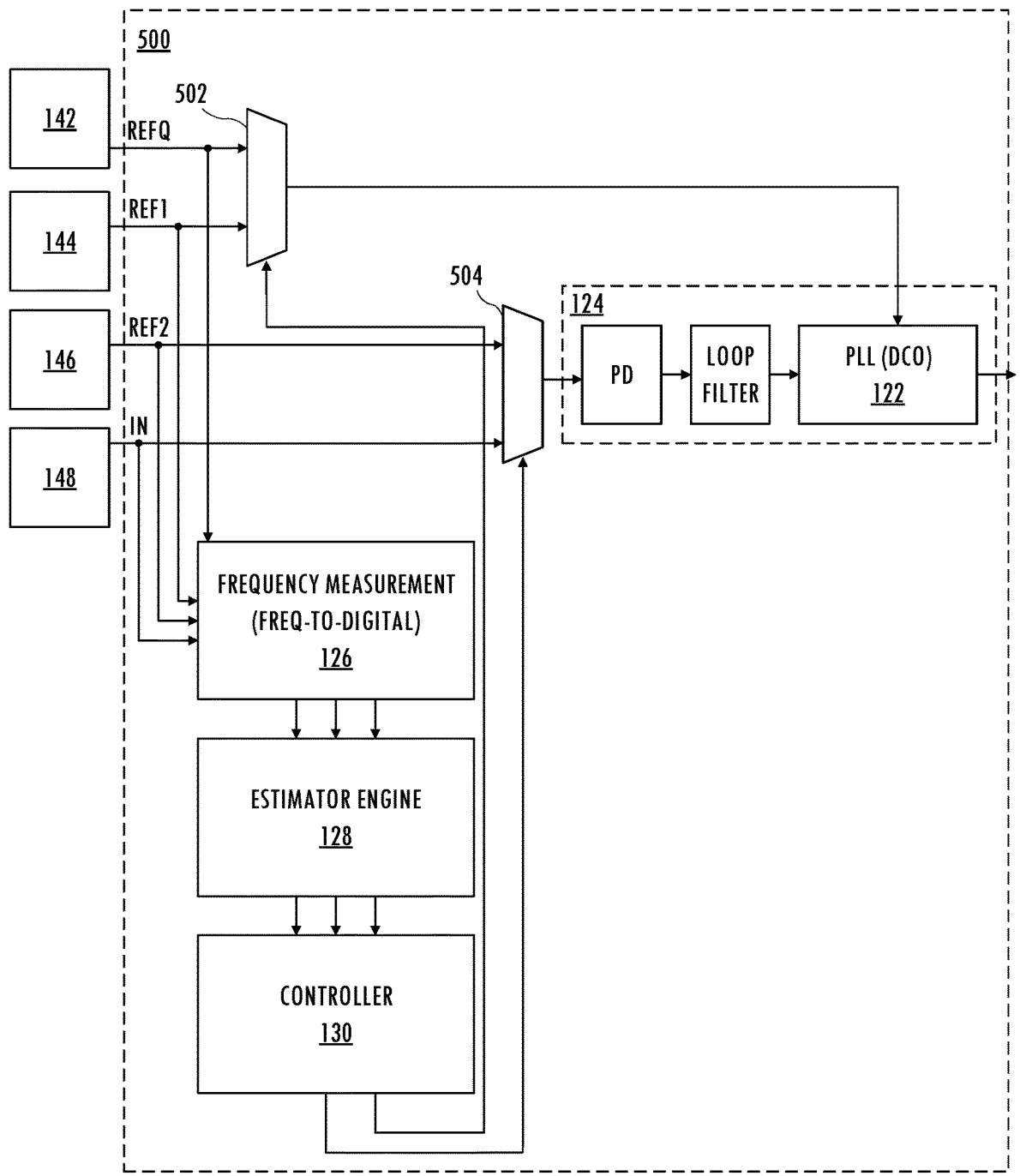
FIG. 9 illustrates a functional block diagram of clock generation circuitry using frequency estimation to select active clock signals for a phase-locked loop including a second phase locked loop configured as a controllable oscillator consistent with at least one embodiment of the invention.

Referring to FIG. 6, phase-locked loop 122 and phase-locked loop 124 are configured as independent phase-locked loops that receive corresponding selected input signals. For example, phase-locked loop 122 receives a first active clock signal that is selected from clock signal REFQ and clock signal REF1 by select circuit 502. Phase-locked loop 124 receives a second active clock signal selected from clock signal REF2 and clock signal IN by select circuit 504. Controller 130 generates control signals for select circuits 502 and 504 based on statistics generated by estimator engine 128 and predetermined quality metrics Referring to FIG. 7, in at least one embodiment, clock product 500 is configured to cascade phase-locked loop 122 and phase-locked loop 124 cascaded to form phase-locked loop 826. Phase-locked loop 826 uses the second active clock signal to configure an internal reference oscillator (e.g., a voltage-controlled oscillator (VCO) or a digitally-controlled oscillator (DCO)) of phase-locked loop 124, as described above. Referring to FIG. 8, in some embodiments, clock product 500 incorporates voltage-controlled oscillator 152 that provides an internally-generated reference clock signal to frequency measurement engine 126. Referring to FIG. 9, in at least one embodiment, phase-locked loop 122 is configured as a reference oscillator (e.g., voltage-controlled oscillator or a digitally-controlled oscillator) that is part of phase-locked loop 124. The first active input controls reference oscillator operation of phase-locked loop 122.

Referring to FIGS. 5-9, in at least one embodiment, estimator engine 128 estimates a current frequency count (C), an average frequency count (A), and the variation of the last n frequency counts (S) for each sensed clock signal using a reference clock signal. Controller 130 makes control decisions based on those statistics and a predetermined quality metric. Accordingly, embodiments of clock product 500 sense available clock signals and change the reference clock signal from a failing clock signal to an alternate clock signal or initiate a holdover configuration in a fail-safe clock product application. In at least one embodiment, clock product 500 is configured in a PTP packet processing application used to process PTP packets identifies and ignores unreliable error estimates in a PTP packet processing application. Some embodiments of a clock product implementing these estimation techniques make other control decisions using the estimate information (e.g., statistics for phase information frequency deviation, jitter (As a variation in frequency deviation), instantaneous changes to frequency, etc. may be used to change active input clock signals, initiating holdover mode, exiting holdover mode, etc.).

In at least one embodiment, the clock product uses input REFQ as the reference clock signal and estimates current frequency count (C), average frequency count (A), and the variation of the last n frequency counts (S) for each sensed clock signal IN, REF1, and REF2. Estimator engine 128 uses those estimates to determine a positive frequency deviation (Ep), a negative frequency deviation (En), and an average frequency deviation (P) for each sensed clock signal:

$$E_{INp}=C_{IN}-(A_{IN}+x\times S_{IN})\ E_{REF1p}=C_{REF1}-(A_{REF1}+x\times S_{REF1})\ E_{REF2p}=C_{REF2}-(A_{REF2}+x\times S_{REF2})$$

$$E_{INn}=C_{IN}-(A_{IN}-x\times S_{IN})\ E_{REF1n}=C_{REF1}-(A_{REF1}x\times S_{REF1})\ E_{REF2n}=C_{REF2}-(A_{REF2}-x\times S_{REF2})$$

$$P_{IN}=(E_{INp}+E_{INn})/2\times A_{IN}\ P_{REF1}=(E_{REF1p}+E_{REF1n})/2\times A_{REF1}\ P_{REF2}=(E_{REF2p}+E_{REF2p})/2\times A_{REF2}.$$

In at least one embodiment, the clock product uses the positive frequency deviation (Ep), negative frequency deviation (En), and average frequency deviation (P) to determine whether to switch an active clock signal from clock signal REFQ to another clock signal for a phase-locked loop. If no loss-of-signal is detected for clock signals IN, REF1, and REF2, and if positive frequency deviation $E_{INp}$ is greater than zero or negative frequency deviation $E_{INn}$ is less than zero (i.e., if ($E_{INp}>0\|EN,<0$)), and if the average frequency deviation is equal for the sensed clock signals (i.e., $P_{IN}=P_{REF1}=P_{REF2}$), then controller 130 causes select circuit 502 to switch the active clock signal for phase-locked loop 122 from clock signal REFQ to an alternate input clock signal (e.g., clock signal REF1).

Figure 7:
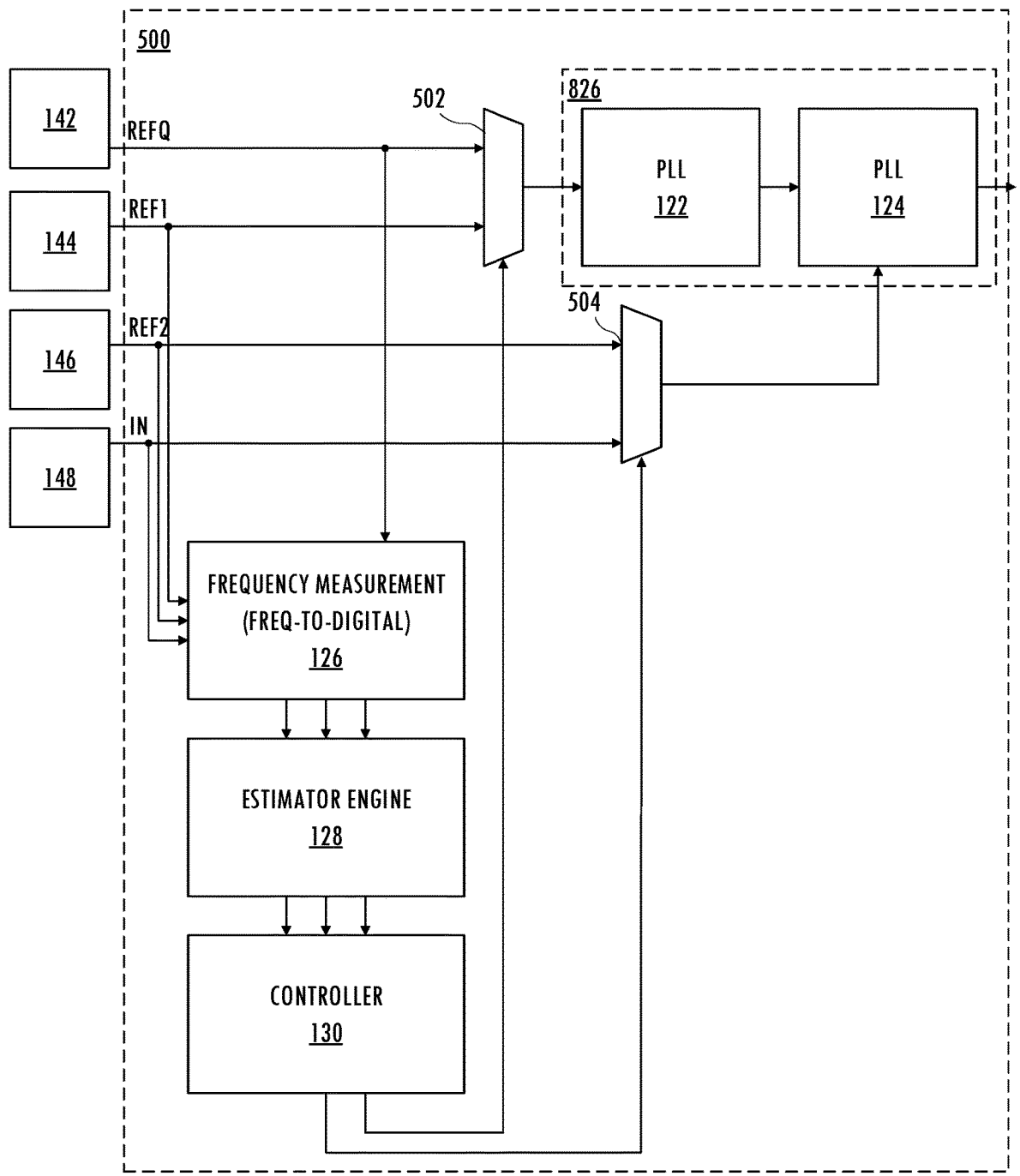
FIG. 7 illustrates a functional block diagram of clock generation circuitry using frequency estimation to select active clock signals for cascaded phase-locked loops consistent with at least one embodiment of the invention.

Referring to FIG. 7, in an exemplary fail-safe clock product application, controller 130 causes select circuit 502 to switch from providing clock signal REFQ to providing clock signal REF1 to phase-locked loop 122. Controller 130 makes a similar decision for select circuit 502 and phase-locked loop 122 of FIG. 5. If there is no loss-of-signal for sensed clock signals IN, REF1, and REF2, and if positive frequency deviation $E_{INp}$ is greater than zero or negative frequency deviation $E_{INn}$ is less than zero (i.e., if ($E_{INp}>0\|E_{INn}<0$)), and if the average frequency deviation of clock signal IN is greater than the average frequency deviation of clock signal REF1 or clock signal REF2 (i.e., $P_{IN}>(P_{REF1}\|P_{REF2})$), then clock signal IN is failing and controller 130 switches the second active signal provided to phase-locked loop 124 from clock signal IN to clock signal REF2. For example, controller 130 causes select circuit 504 to switch from providing clock signal IN to providing clock signal REF2 to phase-locked loop 124.

If a loss of signal condition was detected for clock signal IN, the active clock signal for phase-locked loop 124, and no loss-of-signal condition was detected for clock signals REF or REF2, if positive frequency deviation $E_{REF2p}$ is greater than zero or negative frequency deviation $E_{REF2n}$ is less than zero (i.e., if ($E_{REF2p}>0\|E_{REF2n}<0$)), and if the average frequency deviation of clock signal REF1 is equal to the average frequency deviation of clock signal REF2 (i.e., $P_{REF1}=P_{REF2}$), then the active clock signal for phase-locked loop 122, clock signal REFQ is failing and controller 130 initiates a switch of the reference clock signal for phase-locked loop 122 from clock signal REFQ to an alternate input clock signal (e.g., input clock signal REF1). For example, controller 130 causes select circuit 502 to switch from providing clock signal REFQ to providing clock signal REF1 as the active clock signal for phase-locked loop 122.

If a loss of signal condition was detected for clock signal IN, the active clock signal for phase-locked loop 124, and no loss-of-signal condition was detected for clock signal REF1 or REF2, if positive frequency deviation $E_{REF2p}$ is greater than zero or negative frequency deviation $E_{XREF2n}$ is less than zero (i.e., if ($E_{REF2p}$>0||$E_{REF2n}$<0)), and if the average frequency deviation of clock signal REF1 is less than the average frequency deviation of clock signal REF2 (i.e., $P_{REF}$<$P_{REF2}$), then clock signal REF2, the alternate clock signal for phase-locked loop 124, is failing and controller 130 initiates a switch of the active clock signal for outer phase-locked loop 124 to a holdover condition and the clock product provides a holdover clock signal using techniques described above.

Referring to FIG. 8, in at least one embodiment, a fail-safe clock product includes a voltage-controlled oscillator-derived clock signal being used as the reference clock signal for frequency measurement engine 126. Accordingly, controller 130 makes different decisions based on the collected statistics (described above for clock signals XIN, REF1, and REF2), and estimator engine 128 generates the following additional statistics for clock signal REFQ:

$$E_{REFQp}=C_{REFQ}-(A_{REFQ}+x \times S_{REFQ})$$

$$E_{REFQn}=C_{REFQ}-(A_{REFQ}-x \times S_{REFQ})$$

$$P_{REFQ}=(E_{REFQp}+E_{REFQn})/2 \times A_{REFQ}.$$

If no loss-of-signal is detected for clock signals REFQ, REF1, REF2, and IN and if positive frequency deviation $E_{REFQp}$ is greater than zero or negative frequency deviation $E_{REFQn}$ is less than zero (i.e., if ($E_{REFQp}$>0||$E_{REFQn}$<0)), and if the average frequency deviation for clock signals REFQ, REF1, and REF22 are less than the average frequency deviation for clock signal REFQ (i.e., $P_{IN}$, $P_{REF1}$, $P_{REF2}$<$P_{REFQ}$), then clock signal REFQ is failing, and controller 130 initiates a switch of the active clock signal provided to phase-locked loop 122 from clock signal REFQ to an alternate clock signal (e.g., input clock signal REF1). For example, controller 130 causes select circuit 502 to switch from providing clock signal REFQ as the active clock signal to providing clock signal REF1 as the active clock signal for phase-locked loop 122.

If no loss-of-signal is detected for clock signals REFQ, REF1, REF2, and IN, and if positive frequency deviation $E_{REFQp}$ is greater than zero or negative frequency deviation $E_{REFQn}$ is less than zero (i.e., if ($E_{REFQp}$>0||$E_{REFQn}$<0)), and if the average frequency deviation for clock signals REFQ, REF1, and REF2 are less than the average frequency deviation for clock signal IN (i.e., $P_{REFQ}$, $P_{REF1}$, $P_{REF2}$<$P_{IN}$), then the active clock signal for phase-locked loop 124 (e.g., clock signal IN) is failing and controller 130 initiates a switch of the active clock signal for phase-locked loop 124 from clock signal IN to an alternate clock signal (e.g., clock signal REF2). For example, controller 130 causes select circuit 504 to switch from providing clock signal IN to providing clock signal REF2 to phase-locked loop 124.

If a loss of signal condition is detected for clock signal IN, the active clock for phase-locked loop 124, but there is no loss-of-signal condition for either alternate clock signal (e.g., clock signal REF1 and clock signal REF2), and if positive frequency deviation $E_{REFQp}$ is greater than zero or negative frequency deviation $E_{REFQn}$ is less than zero (i.e., if ($E_{REFQp}$>0||$E_{REFQn}$<0)), and if the average frequency deviation for clock signals REF1, REF2 are equal and less than the average frequency deviation for clock signal REFQ (i.e., $P_{REF1}$=$P_{REF2}$<$P_{REFQ}$), then clock signal REFQ is failing and controller 130 initiates a switch of the active clock signal for phase-locked loop 122 from clock signal REFQ to an alternate clock signal (e.g., clock signal REF1). For example, controller 130 causes select circuit 502 to switch from providing REFQ to providing REF1 to phase-locked loop 122.

If a loss of signal condition is detected for clock signal IN, the active input to phase-locked loop 124, but there is no loss-of-signal condition for either alternate clock signal (e.g., clock signal REF1 and clock signal REF2), and if positive frequency deviation $E_{REF2p}$ is greater than zero or negative frequency deviation $E_{REF2n}$ is less than zero (i.e., if ($E_{REF2p}$>0||$E_{REF2n}$<0)), and if the average frequency deviations for clock signal REF1 and clock signal REFQ are less than the average frequency deviation for clock signal REF2, (i.e., $P_{REFQ}$, $P_{REF1}$<$P_{REF2}$), then the second alternate clock signal for phase-locked loop 124 (i.e., clock signal REF2) is failing and controller 130 initiates a holdover configuration. If the average frequency deviation for all frequency inputs is greater than a threshold frequency deviation, then controller 130 disables the outputs of clock product 500 and sends an indication that all outputs are failing or that a reference clock signal is failing.

In at least one embodiment, the frequency estimation techniques described above are adapted to feedback loops stabilized by a local reference (e.g., a TCXO or OCXO) and locked to a network clock (e.g., SyncE clock, GPS clock, or clock based on PTP packets) for Precision Time Protocol control loops (e.g., control loops implemented in T-Boundary Clock and T-Assisted Partial Time Support) to provide reliable Time of Day (ToD), time, and phase information to slave devices. However, the network clocks can be unreliable and may require estimation of channel effects.

An exemplary measurement window is set by the 1 pulse per second (PPS) clock for sampling PTP packets or SyncE clock. PTP packets suffer from delay variation in the local area network and result in errors due to delay estimates. The frequency estimation technique senses these errors and is used to filter these errors. In existing techniques, the response of a phase-locked loop in a clock product is configured to be very slow to allow a phase-locked loop to track to the average period inferred from PTP packets. As a result, the slow response is unable to detect fast changing network delays in the local area network or to correct for true errors from a local oscillator or SyncE reference.

Figure 10:
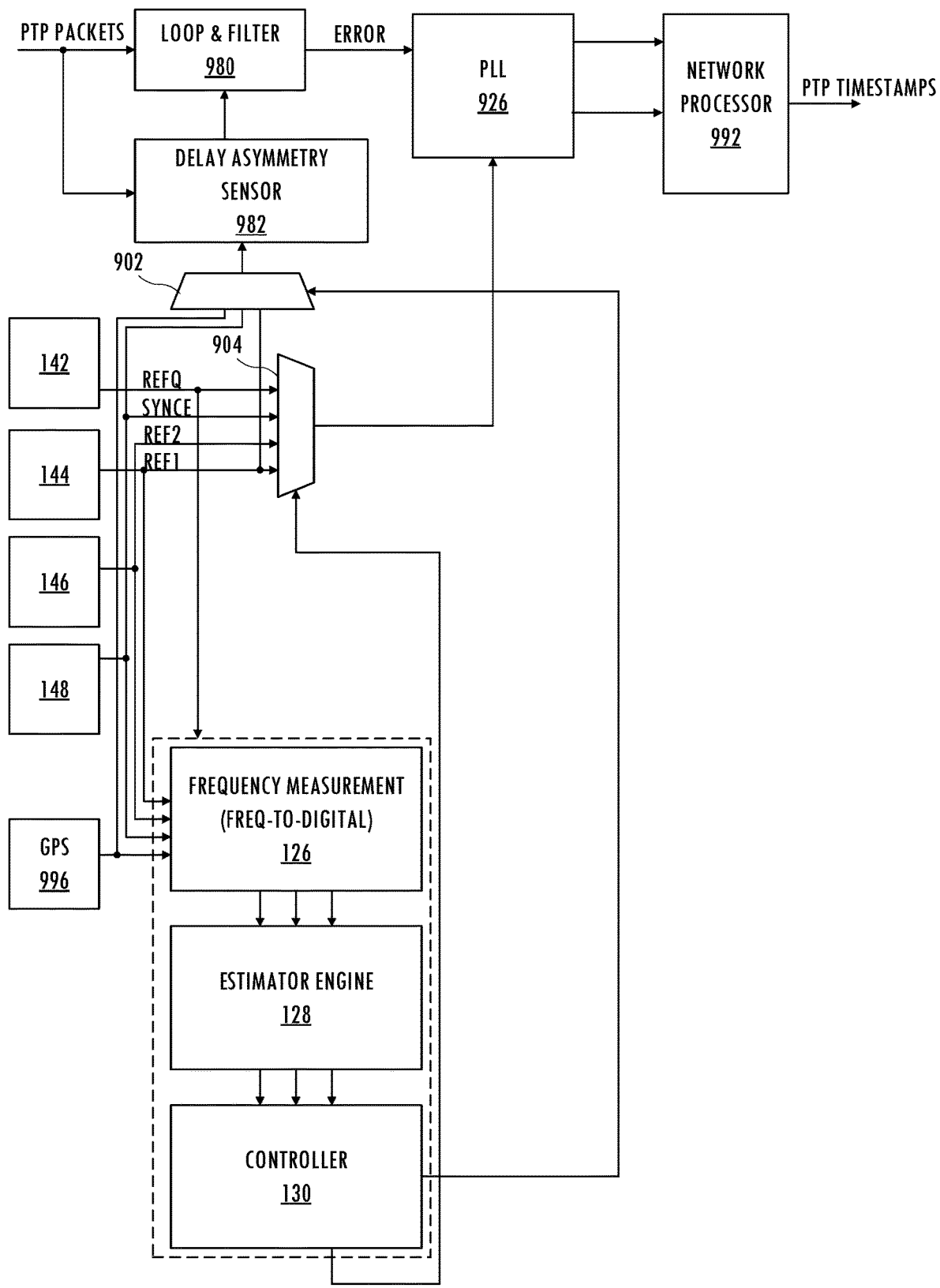
FIG. 10 illustrates a functional block diagram of clock generation circuitry using frequency estimation to select active clock signals for providing delay-adjusted PTP timestamps consistent with at least one embodiment of the invention.

A technique for delay adjustment using frequency estimation uses an extra local clock reference to estimate the reference clock signal error when SyncE and/or GPS clock signals are present to improve a delay estimate for the PTP packets and packet delay variation estimates. Thus, the performance improves in systems that have unequal forward and reverse delays. Referring to FIG. 10, in an embodiment of an exemplary PTP clock product, the frequency estimation technique uses clock signal REF2 (e.g., generated by crystal oscillator 146 which is an OCXO in some embodiments) as the reference clock signal and monitors SyncE clock signal (clock signal IN) and clock signal GPS which are two independent and randomly varying network clock sources. The technique determines whether clock signal GPS is available and if so, uses clock signal GPS to estimate PTP network delay. Controller 130 configures select circuit 902 to provide the higher-quality signal of the SyncE clock signal and the GPS clock signal as the active signal for delay asymmetry sensor 982. In some embodiments, select circuit 902 provides clock signal REF1 in response to controller 130 determining that the GPS clock signal provided by GPS receiver 996 and the SyncE clock signal are failing.

When a timestamp is communicated over a network, an unknown path delay occurs. Some systems assume that the path delay between a remote master and a local receiver is symmetric, i.e., the path delay between the remote master to the local receiver (receiver path) is equal to the path delay between the local receiver and the remote master (transmitter path)). However, those paths are asymmetric in some networks. For example, some embodiments of Ethernet networks using the PTP protocol have asymmetric path delay. Delay asymmetry sensor 982 generates an error signal indicative of the asymmetric path delay based on the difference between transmit and receive paths for the PTP packets. Delay asymmetry sensor 982 provides that error signal to loop and filter 980. Loop and filter 980 receives PTP packets, which include timestamp information that indicate the difference between the local time of the transmitting node and a time of a master clock and uses the error signal to reduce or eliminate that error from the PTP packet clock signal. Loop and filter 980 provides an actual error that is to be corrected by phase-locked loop 926. Network processor 992 generates corrected PTP timestamps based on the output of phase-locked loop 926. Network processor 992 communicates the corrected PTP timestamps over the Ethernet network to downstream devices for synchronization.

One of the independent and randomly varying clock sources (e.g., clock signal REF2) is the SyncE clock. The other clock source (e.g., clock signal REF1) is another local oscillator. Controller 130 estimates the frequency errors in the two independent clock sources and collects statistics for the frequency data for input clock signals:

$$E_{GPSp} = C_{GPS} - (A_{GPS} + x \times S_{GPS}) \ E_{REF1p} = C_{REF1} - (A_{REF1} + x \times S_{REF1}) \ E_{SEp} = C_{SE} - (A_{SE} + x \times S_{SE})$$

$$E_{GPSn} = C_{GPS} - (A_{GPS} - x \times S_{GPS}) \ E_{REF1n} = C_{REF1} - (A_{REF1} - x \times S_{REF1}) \ E_{SEn} = C_{SE} - (A_{SE} - x \times S_{SE})$$

$$P_{GPS} = (E_{GPSp} + E_{GPSn})/2 \times A_{GPS} \ P_{REF1} = (E_{REF1p} + E_{REF1n})/2 \times A_{REF1} \cdot P_{SE} = (E_{SEp} + E_{SEp})/2 \times A_{SE}.$$

Controller 130 uses those statistics to decide whether to update GPS statistics and whether to use the GPS clock to estimate PTP network delays. For example, if a GPS clock signal is available and the phase-locked loop is locked, if positive frequency deviation $E_{GPSp}$ is greater than zero or negative frequency deviation $E_{GPSn}$ is less than zero and if the average frequency deviation of the GPS clock signal is greater than the average frequency deviation of the SyncE clock signal (i.e., if $((E_{GPSp}>0 \| E_{GPSn}<0)$ and if $(P_{GPS}>P_{SE}))$ then controller 130 determines that the GPS clock signal is failing and does not update stored GPS statistics. Accordingly, the clock product does not use the GPS clock signal to estimate PTP network delays. If the GPS clock signal is available and phase-locked loop is locked, if positive frequency deviation $E_{GPSp}$ is greater than zero or negative frequency deviation $E_{GPSn}$ is less than zero and if the average frequency deviation of the GPS clock signal equals the average frequency deviation of the SyncE clock signal and is greater than the average frequency deviation of the local frequency source (REF1) (i.e., if $((E_{GPSp}>0 \| E_{GPSn}<0)$ and if $(P_{GPS}=P_{SE}>P_{REF1}))$ then controller 130 determines that the GPS clock signal is failing and does not update stored GPS statistics and the clock product does not use the GPS clock signal as the active clock signal provided by circuit 902 to delay asymmetry sensor 982 as the active clock signal used to estimate PTP network delays. In at least one embodiment, the phase-locked loop generates a reference signal based on the difference in timestamps received from a remote master clock signal and the local clock signal (e.g., PTP messages). The error from delay asymmetry sensor 982 is removed from this difference to provide a corrected difference that is compensated by phase locked loop to provide an output signal that is synchronized by the remove master.

If the GPS clock signal is available and the phase-locked loop is locked, and if positive frequency deviation $E_{GPSp}$ is greater than zero or negative frequency deviation $E_{GPSn}$ is less than zero and if the average frequency deviation of the GPS clock signal is greater than the average frequency deviation of the clock signal REF1 and if the average frequency deviation of the SyncE clock signal is greater than the average frequency deviation of the local clock signal (REF1) (i.e., if $((E_{GPSp}>0 \| E_{GPSn}<0)$ and if $(P_{GPS}>P_{REF1})$ and if $(P_{SE}>P_{REF1}))$ then controller 130 determines that the GPS clock signal is failing, and does not update stored GPS statistics, and delay asymmetry sensor 982 does not use the GPS clock signal to estimate PTP network delays.

However, if the GPS clock signal is available and the phase-locked loop is locked, if positive frequency deviation $E_{GPSp}$ is less than zero or negative frequency deviation $E_{GPSn}$ is greater than zero and if the average frequency deviation of the GPS clock signal is less than the average frequency deviation of clock signal REF1 (i.e., if $((E_{GPSp}<0 \| E_{GPSn}>0)$ and if $(P_{GPS}<P_{REF1}))$ then controller 130 determines that the current frequency of the GPS clock signal is satisfactory, estimator engine 128 updates stored GPS statistics, and delay asymmetry sensor 982 uses the GPS clock signal to estimate PTP network delays.

In at least one embodiment, when the GPS clock signal is unavailable and the phase-locked loop is locked, controller 130 makes different decisions based on the following collected statistics:

$$E_{REF1p} = C_{REF1} - (A_{REF1} + x \times S_{REF1}) \ E_{SEp} = C_{SE} - (A_{SE} + x \times S_{SE})$$

$$E_{REF1n} = C_{REF1} - (A_{REF1} - x \times S_{REF1}) \ E_{SEn} = C_{SE} - (A_{SE} - x \times S_{SE})$$

$$P_{REF1} = (E_{REF1p} + E_{REF1n})/2 \times A_{REF1} \ P_{SE} = (E_{SEp} + E_{SEp})/2 \times A_{SE}$$

If positive frequency deviation $E_{SEp}$ is greater than zero or negative frequency deviation $E_{SEn}$ is less than zero and if the average frequency deviation of the SyncE clock signal is greater than the average frequency deviation of the clock signal REF1 (i.e., if $((E_{SEp}>0 \| E_{SEn}<0)$ and if $(P_{SE}>P_{REF1}))$ then controller 130 does not select the SyncE clock signal as input to delay asymmetry sensor 982 to modify the PTP network delay estimate. If positive frequency deviation $E_{SEp}$ is less than zero or negative frequency deviation $E_{SEn}$ is greater than zero and if the average frequency deviation of the SyncE clock signal is less than the average frequency deviation of clock signal REF1 (i.e., if $((E_{SEp}<0 \| E_{SEn}>0)$ and if $(P_{SE}<P_{REF1}))$, then if the error estimate for the PTP network delay estimate is greater than the average frequency deviation of the SyncE clock signal, controller 130 uses the average frequency deviation of the SyncE clock signal as the PTP network delay estimate and recalculates the PTP network delays.

In at least one embodiment, phase-locked loop 926 includes phase-locked loop 122 cascaded with phase-locked loop 124 to form phase-locked loop 826 of FIG. 8. Controller 130 implements techniques described above to configure select circuit 902 to provide an active clock signal to phase-locked loop 926. In other embodiments, phase-locked loop 926 includes phase-locked loop 124 with phase-locked loop 122 configured as the controllable oscillator of phase-locked loop 124, as illustrated in FIG. 9. Thus, use of a local clock reference and estimating the OCXO error when SyncE or GPS clock signals are present are used to improve delay estimates in PTP packets and improve estimates of packet delay variations even in scenarios where the forward delays and reverse delays are unequal.

In at least one embodiment, a single clock product system is selectively configured to operate in either a T-BC mode or T-APTS mode. When only a GPS clock signal and SyncE network clock signals are available, controller 130 configures the clock product to operate in T-BC mode. In T-BC mode, the error estimate is based on a GPS reference signal, as described above. If only PTP packets and SyncE network clock signals are available, the clock product operates in T-BC mode, and estimator engine 128 is configured to estimate expected error in the local clock signal using the SyncE clock signal. In at least one embodiment, at least some of the control and estimation operations described herein are implemented using firmware executing on a microcontroller. The firmware collects m samples defined by the sample rate from the GPS clock and uses FOS count registers to generate frequency measurements of the input clock signals using the local clock signal as the FOS reference. Another input clock is used to generate those statistics. The firmware uses the frequency estimates to estimate the local clock signal error and to estimate packet delay. In at least one embodiment, the clock product is configured for T-GM mode and a reference clock signal is decimated when the timing error is excessive. In at least one embodiment, estimator engine 128 pipelines GPS timestamps with a delay D, where D is much greater than the processing time for the errors. When a failing GPS clock signal is detected, the present timestamp input is corrected by adding $1/A_{GPS}$ to the previous timestamp.

In at least one embodiment, the clock product described herein is configured as an APTS synchronizer that generates a 1 pulse per second clock, a SYSCLOCK, and SyncE transmit clock signal based on a 1 pulse per second input from a GPS receiver, PTP packets from a PTP unaware network, or a SyncE receive clock signal. If none of those inputs are available, controller 130 causes the APTS synchronizer to enter a holdover mode. When the GPS clock signal is available, the APTS synchronizer uses the GPS clock signal to estimate the delay component of the PTP packets using the phase-locked loop locked to the GPS clock signal described above. The APTS synchronizer estimates both forward and reverse delays. When the GPS clock signal becomes unavailable, the feedback loop locks to the PTP packets and uses packet delay estimates made when the GPS signal was available.

In at least one embodiment, rather than measuring an input clock signal at-speed (i.e., over-sampling), frequency measurement engine 126 frequency divides the input clock signal for measurement at a lower frequency (i.e., sub-sampling). In at least one embodiment, estimator engine 128 is integrated with other clock product circuitry in an integrated circuit and dynamically reacts to changes in input clock signals. In other embodiments, estimator engine 128 is implemented in an external integrated circuit (e.g., a microcontroller unit or a host microprocessor) and dynamically reacts to changes in input clock signals. In at least one embodiment, estimator engine 128 calibrates using a known frequency count determined either during test or initialization. In at least one embodiment, estimator engine 128 uses a predetermined statistical baseline as an input and reacts to input clock states during operation instead of using dynamic measurements for an additional local clock signal input.

Thus, embodiments of techniques for buffering or generating clock signals using statistics for estimated frequencies of input clock signals have been described. Other embodiments monitor clock quality using other combinations of frequency inputs or other decisions for changing inputs. The decisions for the frequency inputs described above are exemplary only, and controller 130 may make other decisions based on other clock inputs or other statistics provided by other embodiments of estimator engine 128 may be used. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A method comprising:
   generating first frequency metrics for a first received network clock signal using a local reference clock signal;
   in response to the first received network clock signal being available and satisfying a quality metric, generating a network delay estimate using a first error estimate based on the first received network clock signal, and updating stored frequency metrics for the first received network clock signal with the first frequency metrics; and
   generating an output clock signal based on received packets and the network delay estimate.

2. The method, as recited in claim 1, wherein the first received network clock signal is a Global Positioning System (GPS) clock signal.

3. The method, as recited in claim 1, wherein the first frequency metrics include a current average frequency count, a prior average frequency count, a standard deviation of prior average frequency counts, and a multiplicative constant corresponding to a number of samples used to determine the current average frequency count, prior average frequency count, and standard deviation.

4. The method, as recited in claim 1, wherein availability of the first received network clock signal is determined based on the first frequency metrics, second frequency metrics for a second received network clock signal, and third frequency metrics for a second local clock signal.

5. The method, as recited in claim 4, wherein the second received network clock signal is a synchronous Ethernet clock signal.

6. The method, as recited in claim 4, further comprising:
   generating the network delay estimate using a second error estimate based on the second frequency metrics in response to the first received network clock signal being unavailable, the second received network clock signal satisfying a second quality metric, and the first error estimate being greater than the second error estimate.

7. The method, as recited in claim 1, further comprising:
generating the first error estimate based on a difference in a forward network packet delay and a backward network packet delay using the first received network clock signal.

8. The method, as recited in claim 1, wherein the network delay estimate is based on precision time protocol timestamps in precision timing protocol packets received over a network.

9. The method, as recited in claim 1, wherein the first received network clock signal is indicated as unavailable in response to a first average frequency deviation of the first received network clock signal being greater than a second average frequency deviation of a second received network clock signal.

10. The method, as recited in claim 1, wherein the first received network clock signal is indicated as unavailable in response to a first average frequency deviation of the first received network clock signal being equal to a second average frequency deviation of a second received network clock signal and greater than a third average frequency deviation of a second local clock signal.

11. A clock product comprising:
a frequency estimator configured to use a local clock signal as a reference clock signal to generate first frequency metrics for a first received network clock signal, second frequency metrics for a second received network clock signal, and third frequency metrics for a second local clock signal; and
a control circuit configured to generate a network delay estimate using a first error estimate based on the first received network clock signal and to update stored frequency metrics for the first received network clock signal with the first frequency metrics, in response to the first received network clock signal being available and satisfying a quality metric,
wherein the clock product is configured to provide an output clock signal based on received packets and the network delay estimate.

12. The clock product, as recited in claim 11, wherein the first received network clock signal is a Global Positioning System (GPS) clock signal.

13. The clock product, as recited in claim 11, wherein the first frequency metrics include a current average frequency count, a prior average frequency count, a standard deviation of prior average frequency counts, and a multiplicative constant corresponding to a number of samples used to determine the current average frequency count, prior average frequency count, and standard deviation.

14. The clock product, as recited in claim 11, wherein the control circuit determines availability of the first received network clock signal based on the first frequency metrics, the second frequency metrics and the third frequency metrics.

15. The clock product, as recited in claim 11, wherein the second received network clock signal is a synchronous Ethernet clock signal.

16. The clock product, as recited in claim 11, wherein the control circuit is configured to generate the network delay estimate using a second error estimate based on the second frequency metrics in response to the first received network clock signal being unavailable, the second received network clock signal satisfying a second quality metric, and the first error estimate being greater than the second error estimate.

17. The clock product, as recited in claim 11, wherein the frequency estimator is configured to generate the first error estimate based on a difference in a forward network packet delay and a backward network packet delay using the first received network clock signal.

18. The clock product, as recited in claim 11, wherein the network delay estimate is generated based on precision time protocol timestamps in precision timing protocol packets received over a network.

19. The clock product, as recited in claim 11, wherein the first received network clock signal is indicated as unavailable in response to a first average frequency deviation of the first received network clock signal being greater than a second average frequency deviation of the second received network clock signal.

20. An apparatus comprising:
means for generating first frequency metrics for a first received network clock signal using a local reference clock signal;
means for generating a network delay estimate using a first error estimate based on the first received network clock signal, and updating stored frequency metrics for the first received network clock signal with the first frequency metrics in response to the first received network clock signal being available and satisfying a quality metric; and
means for generating an output clock signal based on received packets and the network delay estimate.

* * * * *